(12) United States Patent
Matsui

(10) Patent No.: US 10,438,939 B2
(45) Date of Patent: *Oct. 8, 2019

(54) SEMICONDUCTOR INTEGRATED CIRCUIT DEVICE

(71) Applicant: SOCIONEXT INC., Kanagawa (JP)

(72) Inventor: Tooru Matsui, Takatsuki (JP)

(73) Assignee: Socionext Inc., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,149

(22) Filed: Dec. 12, 2018

(65) Prior Publication Data

US 2019/0115337 A1    Apr. 18, 2019

Related U.S. Application Data

(63) Continuation of application No. 15/493,321, filed on Apr. 21, 2017, now Pat. No. 10,186,504, which is a continuation of application No. PCT/JP2015/004955, filed on Sep. 29, 2015.

(30) Foreign Application Priority Data

Oct. 24, 2014    (JP) .................................. 2014-217335

(51) Int. Cl.
*H01L 23/52*        (2006.01)
*H01L 27/02*        (2006.01)
(Continued)

(52) U.S. Cl.
CPC ...... *H01L 27/0248* (2013.01); *H01L 21/3205* (2013.01); *H01L 21/768* (2013.01);
(Continued)

(58) Field of Classification Search
CPC ............ H01L 27/0248; H01L 23/5286; H01L 27/0207; H01L 24/06; H01L 2224/06131; H01L 2924/14; H02H 9/046
(Continued)

(56) References Cited

U.S. PATENT DOCUMENTS

| | | | |
|---|---|---|---|
| 7,528,484 B2 * | 5/2009 | Rakshani | ................ H01L 23/50 257/724 |
| 7,816,708 B2 * | 10/2010 | Maede | ................ H01L 23/5286 257/203 |

(Continued)

FOREIGN PATENT DOCUMENTS

| | | |
|---|---|---|
| JP | 2003-526901 A | 9/2003 |
| JP | 2007-305822 A | 11/2007 |

(Continued)

OTHER PUBLICATIONS

International Search Report issued in Application No. PCT/JP2015/004955 dated Dec. 22, 2015, with English translation.

(Continued)

*Primary Examiner* — Vu A Vu
(74) *Attorney, Agent, or Firm* — McDermott Will & Emery LLP

(57) ABSTRACT

Disclosed herein is a configuration for ensuring ESD protection capability for a core power supply of a semiconductor integrated circuit device, without causing an increase in the circuit area. A first pad row in a core region includes a first pad for core power supply. The first pad is connected to a core power supply interconnect, and supplied with a power supply potential or a ground potential. A second pad row provided outwardly from the first pad row includes a second pad for core power supply. The second pad is supplied with the same power supply or ground potential as the first pad for core power supply, and connected to an I/O cell for core power supply.

19 Claims, 2 Drawing Sheets

(51) Int. Cl.
  *H01L 21/3205* (2006.01)
  *H01L 21/768* (2006.01)
  *H01L 23/528* (2006.01)
  *H01L 23/00* (2006.01)
  *H02H 9/04* (2006.01)

(52) U.S. Cl.
  CPC .......... *H01L 23/5286* (2013.01); *H01L 24/06* (2013.01); *H01L 27/0207* (2013.01); *H01L 27/0296* (2013.01); *H02H 9/046* (2013.01); *H01L 2224/06131* (2013.01); *H01L 2924/0002* (2013.01); *H01L 2924/14* (2013.01)

(58) Field of Classification Search
  USPC .......................................................... 257/773
  See application file for complete search history.

(56) References Cited

U.S. PATENT DOCUMENTS 8,174,123 B2 *   5/2012   Sonohara, Sr. ......... H01L 23/50
                                                          257/773
  10,186,504 B2 *  1/2019   Matsui ................ H01L 21/3205

2001/0011768 A1   8/2001   Kohara et al.
  2003/0006856 A1   1/2003   Miller
  2008/0104554 A1   5/2008   Kobayashi et al.
  2012/0287541 A1  11/2012   Matsui et al.

FOREIGN PATENT DOCUMENTS

JP   2008-078354 A    4/2008
  WO   2011/101943 A1   8/2011

OTHER PUBLICATIONS

Written Opinion issued in Appplication No. PCT/JP2015/004955 dated Dec. 22, 2015, with English translation.
Notice of Allowance issued in related U.S. Appl. No. 15/493,321 dated Sep. 13, 2018.
Office Action issued in related U.S. Appl. No. 15/493,321 dated Mar. 9, 2018.

* cited by examiner

SEMICONDUCTOR INTEGRATED CIRCUIT DEVICE

CROSS-REFERENCE TO RELATED APPLICATIONS

This is a continuation of U.S. patent application Ser. No. 15/493,321 filed on Apr. 21, 2017, now U.S. Pat. No. 10,186,504, which is a continuation of International Application No. PCT/JP2015/004955 filed on Sep. 29, 2015, which claims priority to Japanese Patent Application No. 2014-217335 filed on Oct. 24, 2014. The entire disclosures of these applications are incorporated by reference herein.

BACKGROUND

The present disclosure relates to a semiconductor integrated circuit device including a core region and an I/O region.

In recent years, semiconductor integrated circuits have further increased in scale to have an increasing number of input and output signals. Therefore, in a device including such a semiconductor integrated circuit, namely, a semiconductor integrated circuit device, arranging external connection pads, configured to transmit and receive, for example, signals to or from the outside of the device, in a single row along the periphery of the semiconductor integrated circuit device may define the area of the semiconductor integrated circuit device, resulting in an increase in its area.

Japanese Unexamined Patent Publication No. 2007-305822 discloses a configuration for a semiconductor integrated circuit device in which pads are arranged in multiple rows. In this configuration, the pads through which power is supplied to the core region are arranged to form an innermost one of the multiple rows, and connected to power supply interconnects of a core power supply.

SUMMARY

The configuration disclosed in Japanese Unexamined Patent Publication No. 2007-305822, in which the pads are arranged in multiple rows may reduce an increase in the chip size resulting from an increase in the number of pads. However, in Japanese Unexamined Patent Publication No. 2007-305822, although the pads are provided for the core power supply, no input/output cells (I/O cells) are provided for the core power supply. Therefore, in the configuration of this patent document, an electrostatic discharge (ESD) protection circuit, which is usually provided for an I/O cell for power supply, is not provided for the core power supply, which makes the core power supply vulnerable to ESD.

It is therefore an object of the present disclosure to provide a configuration for a semiconductor integrated circuit device which is capable of ensuring ESD protection capability for a core power supply, without causing an increase in the area of the semiconductor integrated circuit.

A semiconductor integrated circuit device according to an aspect of the present disclosure includes: a core region including an internal circuit; an I/O region surrounding the core region; a core power supply interconnect provided in the core region, and supplying a power supply potential or a ground potential to the core region; a plurality of I/O cells arranged in the I/O region; a first pad row comprised of a plurality of external connection pads, which are at least partially located in the core region; and a second pad row comprised of a plurality of external connection pads, each connected to an associated one of the plurality of I/O cells, and provided outwardly from the first pad row in the semiconductor integrated circuit device. The first pad row includes a first pad for core power supply. The first pad is connected to the core power supply interconnect, and supplied with the power supply potential or the ground potential. The plurality of I/O cells include at least one I/O cell for core power supply. The second pad row includes a second pad for core power supply. The second pad is supplied with the same power supply potential or ground potential as the first pad for core power supply, and connected to the I/O cell for core power supply.

A semiconductor integrated circuit device according to this aspect includes a first pad row, at least partially located in the core region, and a second pad row provided outwardly from the first pad row. The first pad row includes a first pad for core power supply which is connected to a core power supply interconnect, and provided with a power supply potential or a ground potential. The second pad row includes a second pad for core power supply which is provided with the same power supply potential or ground potential as the first pad for core power supply, and is connected to the I/O cell for core power supply. This configuration may supply sufficient power to the core region, while enhancing ESD protection capability for a core power supply.

A semiconductor integrated circuit device according to the present disclosure may ensure ESD protection capability for a core power supply, without causing an increase in the area of the semiconductor integrated circuit.

DETAILED DESCRIPTION

Embodiments of the present disclosure will be described below with reference to the drawings.

Embodiments

Figure 1:
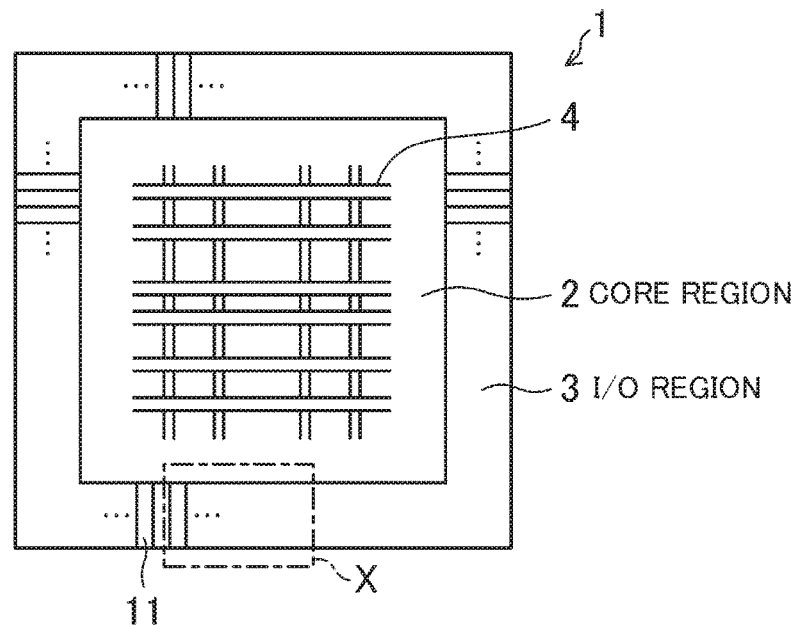
FIG. 1 is a plan view schematically illustrating an entire configuration for a semiconductor integrated circuit device according to an embodiment.

FIG. 1 is a plan view schematically illustrating an entire configuration for a semiconductor integrated circuit device according to an embodiment. The semiconductor integrated circuit device 1 illustrated in FIG. 1 includes a core region 2 in which an internal core circuit is provided, and an I/O region 3 which surrounds the core region 2 and in which an interface circuit (i.e., an I/O circuit) is provided. The core region 2 includes core power supply interconnects 4 configured to supply a power supply potential or a ground potential to the core region 2. For example, the core power supply interconnects 4 are implemented as a mesh grid. Although not illustrated in detail in FIG. 1, the I/O region 3 includes a plurality of I/O cells 11 arranged in a ring or frame shape along the entire periphery of the semiconductor integrated circuit device 1 and forming the interface circuit. Although not illustrated in FIG. 1, the semiconductor integrated circuit device 1 further includes a plurality of external connection pads (hereinafter simply referred to as "pads," as appropriate) arranged therein. The external connection pads are arranged to cover the I/O region 3 entirely and the core region 2 partially.

Figure 2:
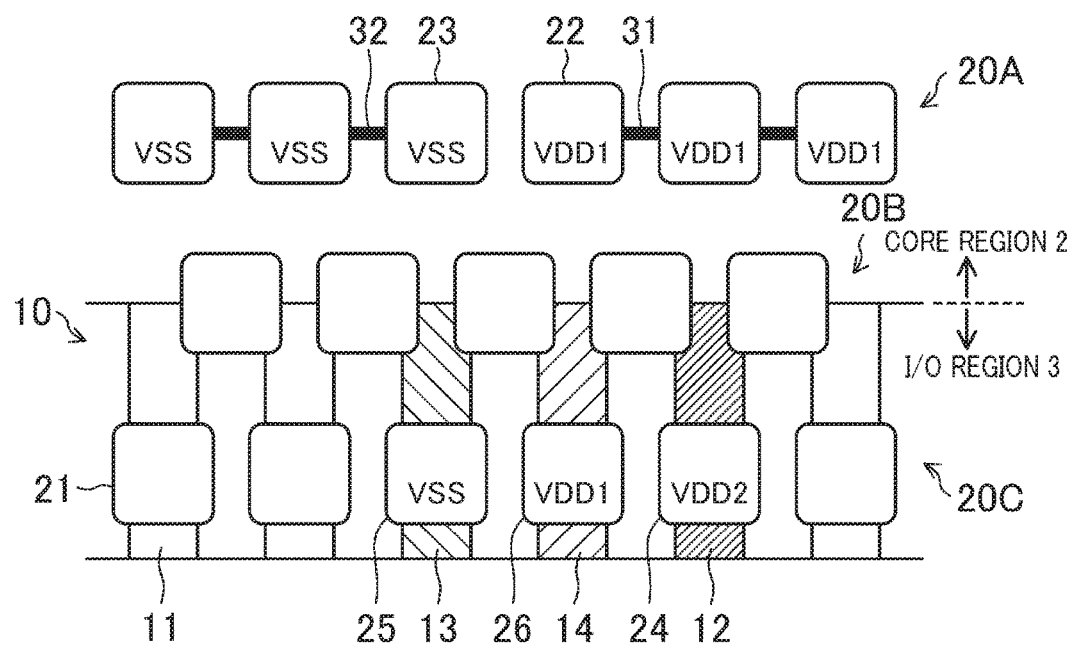
FIG. 2 illustrates an exemplary configuration for an I/O region and its vicinity in a semiconductor integrated circuit device according to an embodiment.

FIG. 2 illustrates an exemplary configuration for the I/O region 3 and its vicinity in the semiconductor integrated circuit device according to this embodiment, and corresponds to an enlarged view of the portion X in FIG. 1. Note that FIG. 2 does not show an internal configuration for each I/O cell, signal interconnects, or other elements. In FIG. 2, the I/O region 3 includes a plurality of I/O cells 11 arranged in the horizontal direction in the figure (i.e., defined along an external side of the semiconductor integrated circuit device 1) to form an I/O cell row 10. The semiconductor integrated circuit device 1 includes a plurality external connection pads 21 which form pad rows 20A, 20B, and 20C arranged outward in this order from the inside of the semiconductor integrated circuit device 1. Each external connection pad 21 is connected the outside of the semiconductor integrated circuit device 1.

The pad row 20A functioning as a first pad row is in the core region 2. The pad row 20A includes core power supply pads 22 through which a core power (a voltage VDD1) is supplied to the core region 2, and core ground pads 23 through which a ground voltage VSS is supplied to the core region 2. None of the pads 21 in the pad row 20A are directly connected to the I/O cells 11. The core power supply pads 22 are directly connected to the core power supply interconnects 4 through which the power supply voltage VDD1 is supplied. The core ground pads 23 are directly connected to the core power supply interconnects 4 through which the ground voltage VSS is supplied. In the configuration of FIG. 2, the core power supply pads 22 are connected to each other via an interconnect 31, and the core ground pads 23 are connected to each other via an interconnect 32. It is beneficial to form these interconnects 31 and 32 and the pads 21 in the same interconnect layer for further reducing resistance. However, the core power supply pads 22 are not necessarily connected together, nor are the core ground pads 23.

Each of the pads 21 included in the pad rows 20B and 20C is connected to an associated one of the I/O cells 11. The pad row 20C functioning as a second pad row is in the I/O region 3. The pad row 20C includes an I/O power supply pad 24 through which I/O power (a voltage VDD2 (>VDD1)) is supplied to the I/O region 3, and an I/O ground pad 25 through which the ground voltage VSS is supplied to the I/O region 3. The pad row 20C further includes a core power supply pad 26 with which the voltage VDD1 is supplied. Here, the core ground pads 23 and the I/O ground pad 25 are configured to function as common ground pads for core power supply and I/O power supply. The other pads 21 of the pad rows 20B and 20C, except the I/O power supply pad 24, the I/O ground 25, and the core power supply pad 26, are provided mainly for inputting and outputting signals.

The core power supply pads 22 and the core ground pads 23 correspond to first pads for core power supply of the present disclosure. The core power supply pad 26 and the I/O ground pad 25 correspond to second pads for core power supply of the present disclosure. The I/O cell row 10 includes an I/O cell 12 for supplying VDD2, an I/O cell 13 for supplying VSS, and an I/O cell 14 for supplying VDD1. The I/O power supply pad 24 is connected to the I/O cell 12. The I/O ground pad 25 is connected to the I/O cell 13. The core power supply pad 26 is connected to the I/O cell 14. These I/O cells 12, 13, and 14 for supplying the power supply potential supply or ground potential supply each include an ESD protection circuit comprising MOS transistors or diodes, for example. The other I/O cells 10 are provided mainly for inputting and outputting signals.

In the configuration illustrated in FIG. 2, the pad row 20A in the core region 2 includes the core power supply pads 22 and the core ground pads 23 that are connected to the core power supply interconnects 4. This enables a supply of sufficient power to the core region 2. The pad row 20C includes the core power supply pad 26 through which the same power supply potential VDD1 as the core power supply is supplied, and the I/O ground pad 25 through which the same ground potential VSS as the core power supply is supplied. Since the core power supply pad 26 and the I/O ground pad 25 are connected to the I/O cells 14 and 13 including the ESD protection circuit, the ESD protection capability may be enhanced for the core power supply. Further, wires such as bonding wires to connect the pad row 20C provided on an outer side to the outside of the device 1 are shorter than those to connect the pad row 20A in the core region 2 to the outside of the device 1. As a result, package wires, connecting the pads in contact with the I/O cells to the outside, may have decreased impedance, thus allowing the ESD protection to work more effectively.

Although the configuration illustrated in FIG. 2 includes the three pad rows 20A, 20B, and 20C, the present disclosure is not limited to this. The advantages of the present disclosure are achieved as long as the semiconductor integrated circuit device includes at least two pad rows including a pad row provided in the core region 2 and a pad row including a pad connected to an I/O cell. The core power supply pad connected to the associated I/O cell does not have to be provided in the outermost row of the semiconductor integrated circuit device 1, but may be included in the pad row 20B in the configuration of FIG. 2, for example. Nevertheless, providing the core power supply pad in the outermost row is more beneficial than providing it in the middle row, because the impedance of the package wires connected to the outside may be reduced further in the former situation.

Further, in the configuration illustrated in FIG. 2, a single core power supply pad 26 and a single I/O ground pad 25 are provided to be connected to their associated I/O cells. However, the configuration according to the present disclosure may include two or more core power supply pads 26 and two or more I/O ground pads 25. An increase in the number of the power supply pads and ground pads connected to the I/O cells further enhances the ESD protection capability. Enhancement of the ESD protection capability for the core power supply may be achieved by providing either, not both, of the power supply and ground pads connected to the I/O cells.

In this embodiment, the core ground pad 23 and the I/O ground pad 25 are configured to function as common ground pads for core power supply and I/O power supply. However, the core ground pad 23 and the I/O ground pad 25 may be electrically isolated from each other.

Furthermore, although a single I/O cell row 10 is provided in this embodiment, the present disclosure is not limited to this. Two or more I/O cell rows may be provided.

Moreover, although the I/O cell row 10 and the pad rows 20A, 20B, and 20C extend in a ring or frame shape along the entire periphery of the semiconductor integrated circuit device 1, the present disclosure is not limited to this. For example, the I/O cell row 10 and the pad rows 20A, 20B, and 20C may also be provided along a portion of the periphery of the semiconductor integrated circuit device 1. The configuration according to this embodiment does not have to be applied to the entire pad rows 20A, 20B, and 20C, and may be applied to only a portion of the pad rows 20A, 20B, and 20C.

(First Variation)

Figure 3:
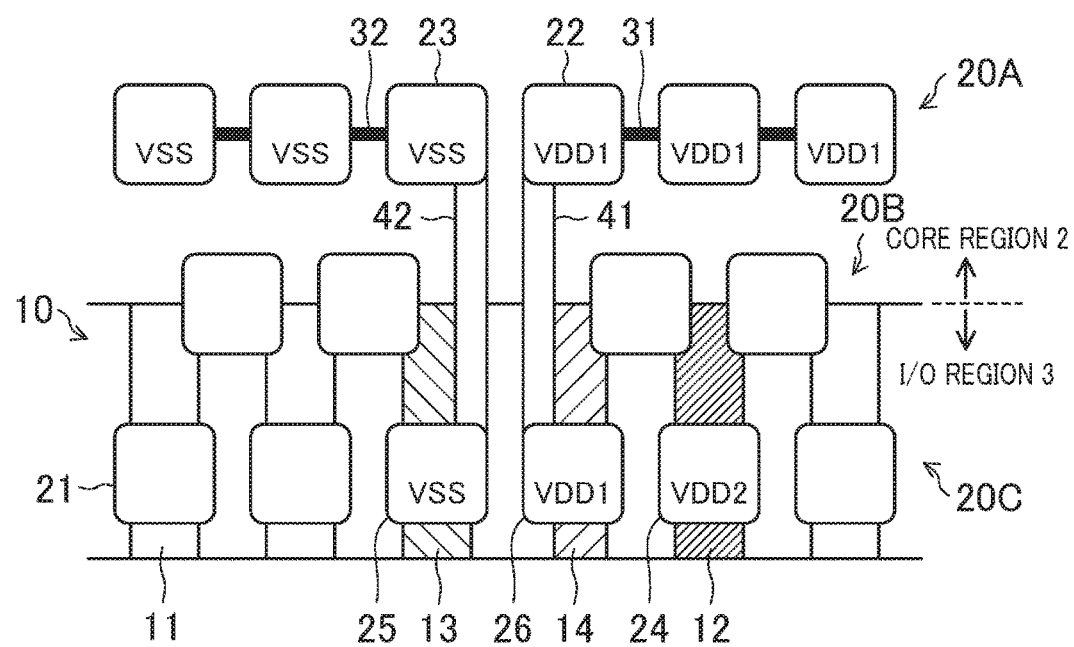
FIG. 3 illustrates an exemplary configuration for an I/O region and its vicinity in a semiconductor integrated circuit device according to a first variation.

FIG. 3 illustrates an exemplary configuration for an I/O region and its vicinity in a semiconductor integrated circuit device according to a first variation. Note that in FIG. 3, components that are the same as those illustrated in FIG. 2 are identified by the corresponding reference characters, and detailed description thereof may be omitted herein. In the configuration illustrated in FIG. 3, some pads are omitted from the pad row 20B functioning as a third pad row, and interconnects 41 and 42 connecting together the pad rows 20A and 20C extend across the pad row 20B through the area that would otherwise be allocated to those pads omitted. The interconnect 41 connects the core power supply pad 22 in the pad row 20A to the core power supply pad 26 in the pad row 20C. The interconnect 42 connects the core ground pad 23 in the pad row 20A to the I/O ground pad 25 in the pad row 20C.

The configuration illustrated in FIG. 3 establishes a low-resistance connection between the core power supply pad 22 in the pad row 20A and the core power supply pad 26 in the pad row 20C. Consequently, a low-resistance connection is established between the I/O cell 14 for core power supply and the core power supply pads 22 via the core power supply pad 26, thereby allowing the ESD protection to work more effectively. Further, the configuration illustrated in FIG. 3 establishes a low-resistance connection between the core power supply pad 26 and the core power supply interconnects 4 via the core power supply pads 22, thereby enhancing the core power supply. Likewise, the configuration illustrated in FIG. 3 establishes a low-resistance connection between the core ground pads 23 in the pad row 20A and the I/O ground pad 25 in the pad row 20C. Consequently, a low-resistance connection is established between the I/O cell 13 for I/O grounding and the core ground pads 23 via the I/O ground pad 25, thereby allowing the ESD protection to work more effectively. Further, a low-resistance connection is established between the I/O ground pad 25 and the core power supply interconnects 4 via the core power supply pads 23, thereby enhancing the core power supply.

Note that either the core power supply pads 22 or the core ground pads 23 in the pad row 20A may be connected to the associated pad in the pad row 20C. The interconnects 41 and 42 are beneficially provided on the interconnect layer where the pads 21 are provided. This allows a further reduction in the resistance of the connection between the core power supply pad 22 and the core power supply pad 26, and the resistance of the connection between the core ground pad 23 and the I/O ground pad 25.

(Second Variation)

Figure 4:
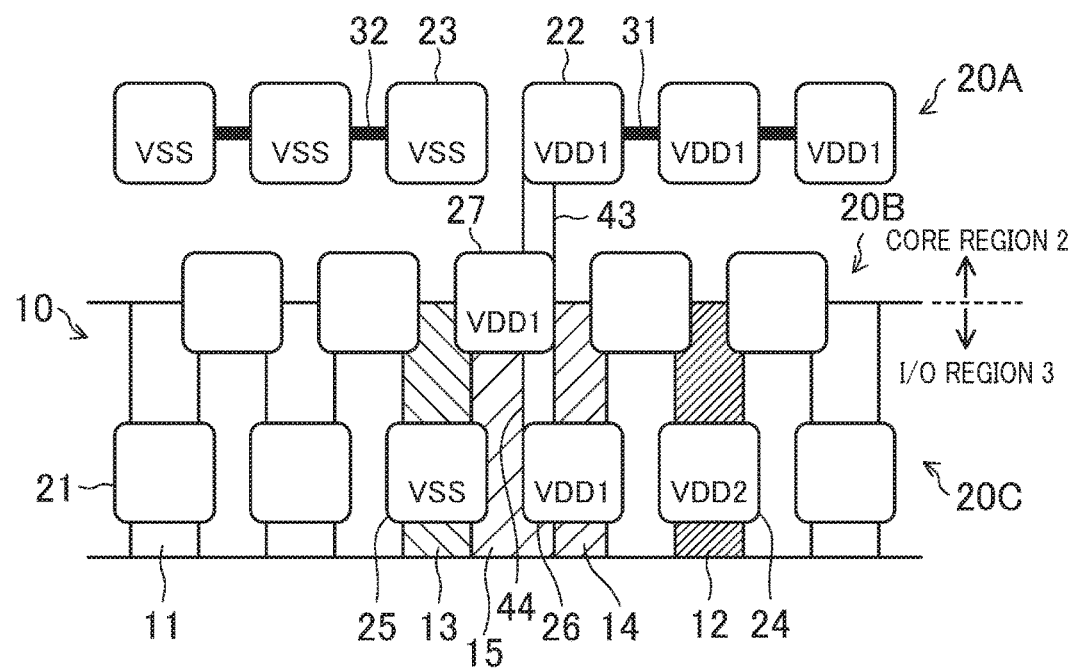
FIG. 4 illustrates an exemplary configuration for an I/O region and its vicinity in a semiconductor integrated circuit device according to a second variation.

FIG. 4 illustrates an exemplary configuration for an I/O region and its vicinity in a semiconductor integrated circuit device according to a second variation. Note that in FIG. 4, components that are the same as those illustrated in FIG. 2 are identified by the corresponding reference characters, and detailed description thereof may be omitted herein. In the configuration illustrated in FIG. 4, the pad row 20B includes a core power supply pad 27 functioning as a third pad for core power supply. This core power supply pad 27 is connected to the core power supply pad 22 in the pad row 20A via an interconnect 43, and to the core power supply pad 26 in the pad row 20C via an interconnect 44. The core power supply pad 27 is also connected to an associated I/O cell 15 for core power supply.

The configuration illustrated in FIG. 4 establishes a low-resistance connection between the core power supply pad 22 in the pad row 20A and the core power supply pad 26 in the pad row 20C as well as the I/O cell 14 for core power supply. Further, the configuration illustrated in FIG. 4 establishes a low-resistance connection between the core power supply pad 22 and the core power supply pad 27 in the pad row 20B as well as the I/O cell 15 for core power supply. As a result, this configuration may further enhance the ESD protection effect and further enhance the core power supply, as compared to the configuration according to the first variation.

Note that the core power supply pad 27 does not have to be connected to the I/O cell. Even in such a case, connecting the core power supply pad 27 to the core power supply pad 22 may further enhance the ESD protection effect and the output power of the core power supply. Although not illustrated, the same or similar configuration may be adopted to the core ground pads 23.

A semiconductor integrated circuit device according to the present disclosure may ensure ESD protection capability for a core power supply, without causing an increase in the area of the semiconductor integrated circuit. The present disclosure is thus useful for reducing the size of a very large-scale integrated circuit with a large number of signal input and output terminals, for example.

What is claimed is:

1. A semiconductor integrated circuit device comprising:
   a core region including an internal circuit;
   an I/O region provided along at least a portion of a periphery of the semiconductor integrated circuit device;
   a core power supply interconnect provided in the core region, and supplying a power supply potential or a ground potential to the core region;
   a plurality of I/O cells arranged in the I/O region;
   a first pad row comprised of a plurality of external connection pads, which are at least partially located in the core region;
   a second pad row comprised of a plurality of external connection pads, each connected to an associated one of the plurality of I/O cells, and provided outwardly from the first pad row in the semiconductor integrated circuit device; and
   a third pad row comprised of a plurality of external connection pads, and provided between the first and second pad rows, the plurality of external connection pads of the first, second and third pad rows being connected to an outside of the semiconductor integrated circuit device, wherein
   the plurality of external connection pads of the first pad row include a first pad for core power supply, the first pad being directly connected to the core power supply interconnect, and supplied with the power supply potential or the ground potential,
   the plurality of I/O cells include at least one I/O cell for core power supply, the at least one I/O cell for core power supply is not directly connected to the first pad,
   the plurality of external connection pads of the second pad row include a second pad for core power supply, the second pad being supplied with the same power supply potential or ground potential as the first pad, and connected to the I/O cell for core power supply, and
   the second pad overlaps with the I/O cell for core power supply in a plan view, and the semiconductor integrated circuit device further includes:
an interconnect extending between adjacent ones of the external connection pads of the third pad row, and directly connecting together the first and second pads.

2. The semiconductor integrated circuit device of claim 1, wherein
the first pad for core power supply of the first pad row comprises a plurality of first pads for core power supply, and
the plurality of first pads for core power supply are connected to each other via an interconnect.

3. The semiconductor integrated circuit device of claim 2, wherein the interconnect connecting the plurality of first pads for core power supply to each other is provided on an interconnect layer where the plurality of first pads for core power supply are provided.

4. The semiconductor integrated circuit device of claim 1, wherein the second pad row is configured as an outermost pad row in the semiconductor integrated circuit device.

5. A semiconductor integrated circuit device comprising:
a core region including an internal circuit;
an I/O region provided along at least a portion of a periphery of the semiconductor integrated circuit device;
a core power supply interconnect provided in the core region, and supplying a power supply potential or a ground potential to the core region;
a plurality of I/O cells arranged in the I/O region;
a first pad row comprised of a plurality of external connection pads, which are at least partially located in the core region;
a second pad row comprised of a plurality of external connection pads, each connected to an associated one of the plurality of I/O cells, and provided outwardly from the first pad row in the semiconductor integrated circuit device; and
a third pad row comprised of a plurality of external connection pads, and provided between the first and second pad rows, the plurality of external connection pads of the first, second and third pad rows being connected to an outside of the semiconductor integrated circuit device, wherein
the plurality of external connection pads of the first pad row include a first pad for core power supply, the first pad being directly connected to the core power supply interconnect, and supplied with the power supply potential or the ground potential,
the plurality of I/O cells include at least one I/O cell for core power supply, the at least one I/O cell for core power supply is not directly connected to the first pad,
the plurality of external connection pads of the second pad row include a second pad for core power supply, the second pad being supplied with the same power supply potential or ground potential as the first pad, and connected to the I/O cell for core power supply, and
the second pad overlaps with the I/O cell for core power supply in a plan view, and
the plurality of external connection pads of the third pad row include a third pad for core power supply, the third pad being connected to the first and second pads via an interconnect.

6. The semiconductor integrated circuit device of claim 5, wherein the third pad for core power supply is connected to any one of the plurality of I/O cells.

7. The semiconductor integrated circuit device of claim 5, wherein
the first pad of the first pad row comprises a plurality of first pads for core power supply, and
the plurality of first pads are connected to each other via an interconnect.

8. The semiconductor integrated circuit device of claim 7, wherein the interconnect connecting the plurality of first pads to each other is provided on an interconnect layer where the plurality of first pads are provided.

9. The semiconductor integrated circuit device of claim 5, wherein the second pad row is configured as an outermost pad row in the semiconductor integrated circuit device.

10. A semiconductor integrated circuit device comprising:
a core region including an internal circuit;
an I/O region provided along at least a portion of a periphery of the semiconductor integrated circuit device;
a core power supply interconnect provided in the core region, and supplying a power supply potential or a ground potential to the core region;
a plurality of I/O cells arranged in the I/O region;
a first pad row comprised of a plurality of external connection pads, which are at least partially located in the core region; and
a second pad row comprised of a plurality of external connection pads, each connected to an associated one of the plurality of I/O cells, and provided outwardly from the first pad row in the semiconductor integrated circuit device, the plurality of external connection pads of the first and second pad rows being connected to an outside of the semiconductor integrated circuit device, wherein
the plurality of external connection pads of the first pad row include a first pad for core power supply, the first pad being directly connected to the core power supply interconnect, and supplied with the power supply potential or the ground potential,
the plurality of I/O cells include at least one I/O cell for core power supply, the at least one I/O cell for core power supply is not directly connected to the first pad,
the plurality of external connection pads of the second pad row include a second pad for core power supply, the second pad being supplied with the same power supply potential or ground potential as the first pad, and connected to the I/O cell for core power supply, and
each of the external connection pads of the second pad row overlaps with at least two of the plurality of I/O cells in a plan view.

11. The semiconductor integrated circuit device of claim 10, wherein a third pad row comprised of a plurality of external connection pads is provided between the first and second pad rows, the plurality of external connection pads of the third pad row being connected to an outside of the semiconductor integrated circuit device.

12. The semiconductor integrated circuit device of claim 11, further comprising:
an interconnect extending between adjacent ones of the external connection pads of the third pad row, and connecting together the first and second pads for core power supply.

13. The semiconductor integrated circuit device of claim 11, wherein the plurality of external connection pads of the third pad row include a third pad for core power supply, the third pad being connected to the first and second pads for core power supply via an interconnect.

14. The semiconductor integrated circuit device of claim 13, wherein the third pad for core power supply is connected to any one of the plurality of I/O cells.

15. The semiconductor integrated circuit device of claim 10, wherein
the first pad for core power supply of the first pad row comprises a plurality of first pads for core power supply, and
the plurality of first pads for core power supply are connected to each other via an interconnect.

16. The semiconductor integrated circuit device of claim 10, wherein the second pad row is configured as an outermost pad row in the semiconductor integrated circuit device.

17. The semiconductor integrated circuit device of claim 11, wherein the external connection pads of the second pad row and the third pad row overlap with the plurality of I/O cells in a plan view.

18. The semiconductor integrated circuit device of claim 10, wherein the core power supply interconnect is implemented as a mesh grid.

19. The semiconductor integrated circuit device of claim 10, wherein the I/O cell for core power supply includes an ESD protection circuit.

* * * * *